United States Patent
Chang et al.

(10) Patent No.: US 9,787,307 B2
(45) Date of Patent: Oct. 10, 2017

(54) HYBRID TOUCH BUTTON AND MODULE USING THE SAME

(71) Applicant: YICHENG PRECISION INC., Tainan (TW)

(72) Inventors: Jen-Chieh Chang, Taipei (TW); Chung-Lin Chia, Taipei (TW); Han-Chang Chen, Taipei (TW); Yen-Hung Tu, Taipei (TW); Chih-Wen Wu, Taipei (TW)

(73) Assignee: YICHENG PRECISION INC., Tainan (TW)

( * ) Notice: Subject to any disclaimer, the term of this patent is extended or adjusted under 35 U.S.C. 154(b) by 0 days.

(21) Appl. No.: 14/956,178

(22) Filed: Dec. 1, 2015

(65) Prior Publication Data

US 2016/0211842 A1    Jul. 21, 2016

(30) Foreign Application Priority Data

Jan. 16, 2015  (TW) ............... 104101453 A

(51) Int. Cl.
| | |
|---|---|
| *H03K 17/94* | (2006.01) |
| *H03M 11/00* | (2006.01) |
| *H01H 67/26* | (2006.01) |
| *G06F 3/041* | (2006.01) |
| *G06F 3/02* | (2006.01) |
| *G09G 5/00* | (2006.01) |
| *H03K 17/96* | (2006.01) |
| *G06F 3/044* | (2006.01) |
| *H01H 13/83* | (2006.01) |
| *H01H 25/06* | (2006.01) |

(52) U.S. Cl.
CPC ........... *H03K 17/962* (2013.01); *G06F 3/044* (2013.01); *G06F 3/0412* (2013.01); *H01H 13/83* (2013.01); *H01H 25/065* (2013.01); *H01H 2219/012* (2013.01); *H01H 2219/016* (2013.01); *H01H 2221/01* (2013.01); *H01H 2221/016* (2013.01); *H01H 2221/018* (2013.01); *H01H 2239/074* (2013.01); *H03K 2217/94036* (2013.01)

(58) Field of Classification Search
CPC ..... H03K 17/962; G06F 3/0412; G06F 3/044; H01H 13/83; H01H 25/065
USPC ..................................... 341/22–35
See application file for complete search history.

(56) References Cited

U.S. PATENT DOCUMENTS

| | | | | |
|---|---|---|---|---|
| 9,164,606 B2* | 10/2015 | Krah | ....... | G06F 3/041 |
| 2010/0271315 A1* | 10/2010 | Bathiche | ....... | G06F 3/0202 |
| | | | | 345/173 |
| 2013/0232238 A1* | 9/2013 | Cohn | ....... | G06F 3/01 |
| | | | | 709/220 |

* cited by examiner

*Primary Examiner* — Firmin Backer
*Assistant Examiner* — Jerold Murphy
(74) *Attorney, Agent, or Firm* — Guice Patents PLLC

(57) ABSTRACT

A hybrid touch button, including: a touch display unit having a touch display area; a mechanical switch having a plurality of conductive contacts; and a control unit, having a power interface for coupling with a power source, a first interface coupled with the touch display area, a second interface coupled with the plurality of conductive contacts, and an output interface, wherein the control unit derives first input information from the first interface and second input information from the second interface, and determines an output configuration of the output interface according to the first input information and the second input information.

12 Claims, 12 Drawing Sheets

HYBRID TOUCH BUTTON AND MODULE USING THE SAME

BACKGROUND OF THE INVENTION

Field of the Invention

The present invention relates to a button device, especially to a hybrid touch button.

Description of the Related Art

Please refer to FIG. 1, which illustrates an outline of a mechanical button with lamp of prior art. As illustrated in FIG. 1, the mechanical button with lamp of prior art includes a body 10, a pressing part 20, and a plurality of switch pins 30, wherein the pressing part 20 has a lamp and the interconnection of the plurality of switch pins 30 is determined via a plurality of mechanical connection structures.

However, when the number of the plurality of mechanical connection structures increases, the reliability of the mechanical button with lamp of prior art will decrease. Besides, when the interconnection of the plurality of switch pins 30 is to be changed, a new mold will be required to manufacture the required product, which will cause much inconvenience.

To solve the foregoing problem, a novel button structure is needed.

SUMMARY OF THE INVENTION

One objective of the present invention is to disclose a hybrid touch button, which is capable of reducing the number of mechanical contacts thereof.

Another objective of the present invention is to disclose a hybrid touch button, which is capable of changing the interconnection structure by software programming.

Another objective of the present invention is to disclose a hybrid touch button, which is capable of providing both a long operational life and a mechanical touch.

Still another objective of the present invention is to disclose a hybrid touch button, which is capable of achieving high noise immunity by providing digital activating signals.

To attain the foregoing objectives, a hybrid touch button is proposed, including:
  a touch display unit having a touch display area;
  a mechanical switch having a plurality of conductive contacts; and
  a control unit, having a power interface for coupling with a power source, a first interface coupled with the touch display area, a second interface coupled with the plurality of conductive contacts, and an output interface, wherein the control unit derives first input information from the first interface and second input information from the second interface, and determines an output configuration of the output interface according to the first input information and the second input information.

In one embodiment, the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being glued to or integrated with the display layer.

In one embodiment, the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being embedded in the display layer or implemented by display electrodes of the display layer.

In one embodiment, the mechanical switch is selected from a group consisting of a pushbutton switch, a rocker switch, a band switch, and any combination thereof.

In one embodiment, the output configuration includes determining a conduction state between at least two pins of the output interface.

In one embodiment, the output configuration includes providing at least one digital activating signal via at least two pins of the output interface.

In one embodiment, the hybrid touch button further includes at least one switch, by which at least one contact of the plurality of conductive contacts can be connected to the output interface when the power source is disrupted.

In one embodiment, the hybrid touch button further includes at least one manual switch for a user to force at least one contact of the plurality of conductive contacts to be connected with the output interface.

In one embodiment, the hybrid touch button further includes an auxiliary capacitor circuit for isolating a display circuit of the touch display unit and supplying power to the display circuit to maintain a display state when the control unit performs a touch detection procedure, wherein the touch detection procedure is selected from a group consisting of a self-capacitive touch detection procedure, a mutual-capacitive touch detection procedure, and a hybrid-signal touch detection procedure.

To attain the foregoing objectives, a hybrid touch module is proposed, including:
  a plurality of hybrid touch buttons, each having a touch display unit and a mechanical switch, wherein the touch display unit has a touch display area, and the mechanical switch has a plurality of conductive contacts;
  a central control unit coupled with the plurality of hybrid touch buttons, having a power interface for coupling with a power source, a first interface for driving the touch display area of each of the plurality of hybrid touch buttons, a second interface coupled with the plurality of conductive contacts of the mechanical switch of each of the plurality of hybrid touch buttons, and an output interface, wherein the central control unit derives first input information from the first interface and second input information from the second interface, and determines an output configuration of the output interface according to the first input information and the second input information; and
  a plurality of objects coupled with the output interface of the central control unit.

To attain the foregoing objectives, another hybrid touch module is proposed, including:
  a plurality of hybrid touch buttons, each including:
    a touch display unit having a touch display area;
    a mechanical switch having a plurality of conductive contacts; and
    a control unit, having a power interface for coupling with a power source, a first interface for driving the touch display area, a second interface coupled with the plurality of conductive contacts, and an output interface, wherein the control unit derives first input information from the first interface and second input information from the second interface, and determines an output configuration of the output interface according to the first input information and the second input information;

a central control unit coupled with the plurality of hybrid touch buttons; and a plurality of objects coupled with the central control unit;

wherein the central control unit receives touch operation information from the plurality of hybrid touch buttons and controls the plurality of objects according to the touch operation information.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

Figure 1:
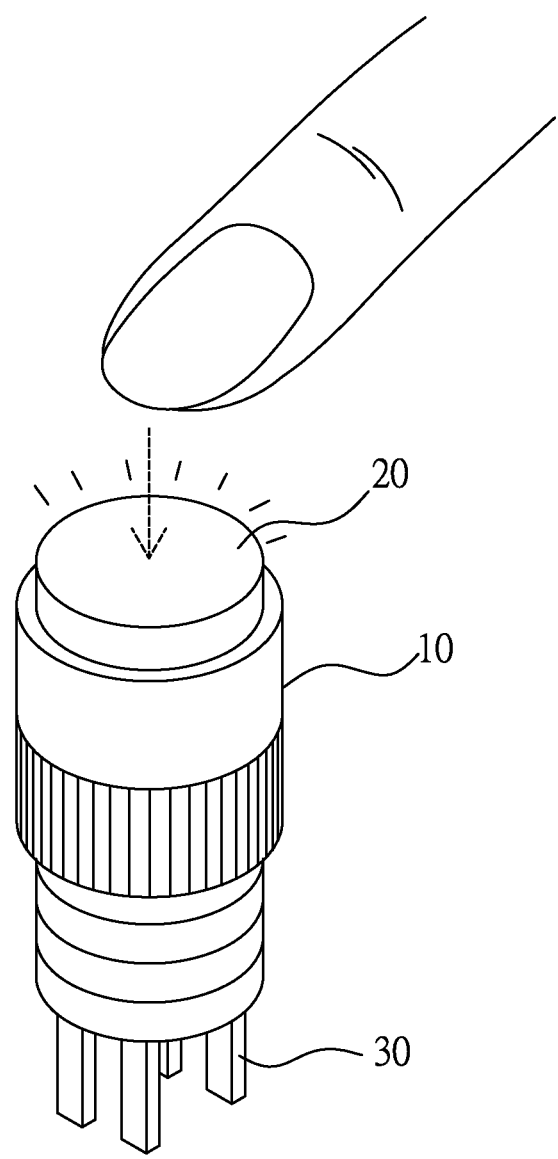
FIG. 1 illustrates an outline of a mechanical button with lamp of prior art.
Figure 2:
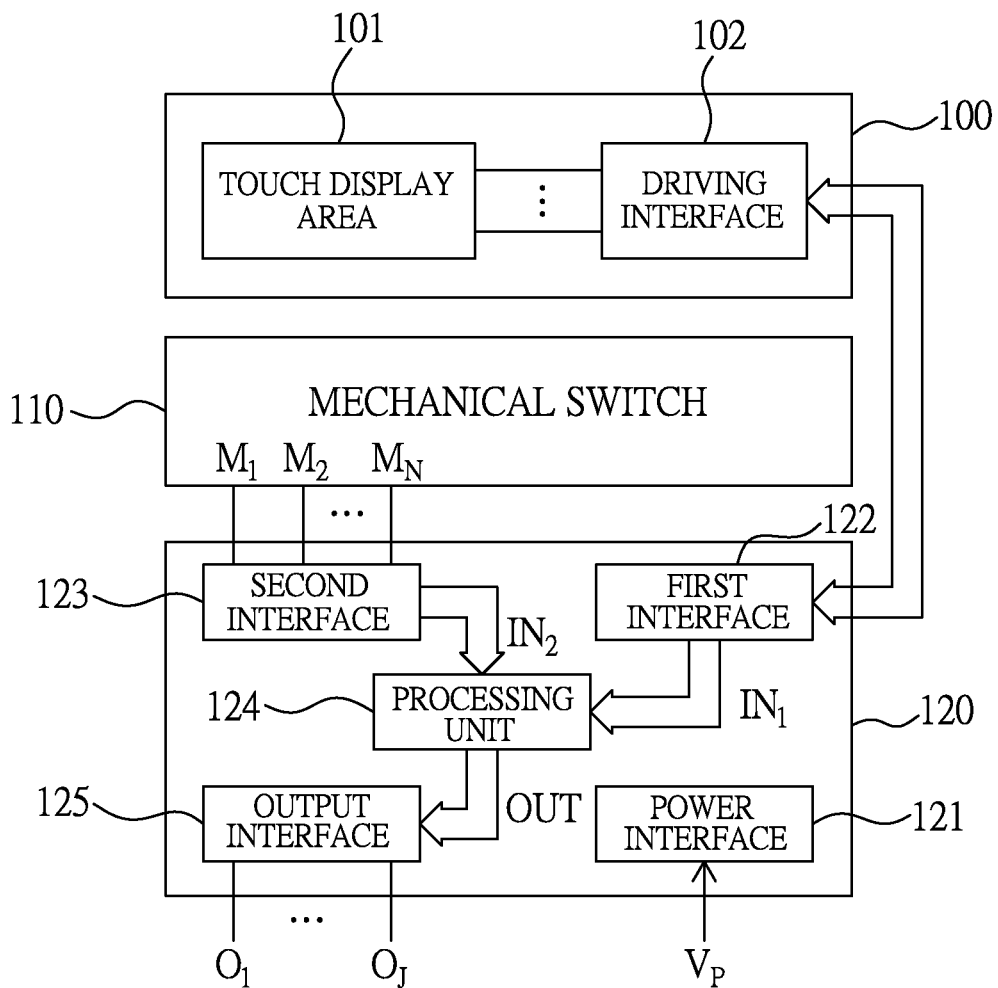
FIG. 2 illustrates an embodiment of a hybrid touch button of the present invention.

Please refer to FIG. 2, which illustrates an embodiment of a hybrid touch button of the present invention. As illustrated in FIG. 2, the hybrid touch button includes a touch display unit 100, a mechanical switch 110, and a control unit 120.

The touch display unit 100 has a touch display area 101 and a driving interface 102. The touch display area 101 includes a display layer and a touch sensing layer (not shown in the figure), the display layer can be a liquid crystal display layer, an organic light emitting diode display layer, a polymer light emitting diode display layer, or an electronic paper display layer, and the touch sensing layer can be glued to or integrated with the display layer, or embedded in the display layer or implemented by display electrodes of the display layer. The driving interface 102 is used to drive the touch display area 101 to provide a touch display function according to at least one pixel driving signal and at least one touch detection signal. Besides, the driving interface 102 is not limited to being located inside the touch display unit 100, it can also be located inside the control unit 120.

The mechanical switch 110 has a plurality of conductive contacts $M_1$-$M_N$, and can be a pushbutton switch, a rocker switch, a band switch, or any combination thereof.

The control unit 120 has a power interface 121, a first interface 122, a second interface 123, a processing unit 124, and an output interface 125, wherein, the power interface 121 is for coupling with a power source $V_P$; the first interface 122 is coupled with the driving interface 102; the second interface 123 is coupled with the plurality of conductive contacts $M_1$-$M_N$; and the processing unit 124 derives first input information $IN_1$ from the first interface 122 and second input information $N_2$ from the second interface 123, and generates at least one output control signal OUT to determine an output configuration of connection pins $O_1$-$O_J$ of the output interface 125 according to the first input information $IN_1$ and the second input information $IN_2$, wherein the output configuration can determine a conduction state between at least two pins of the connection pins $O_1$-$O_J$, or provide at least one digital activating signal via at least two pins of the connection pins $O_1$-$O_J$.

Figure 3:
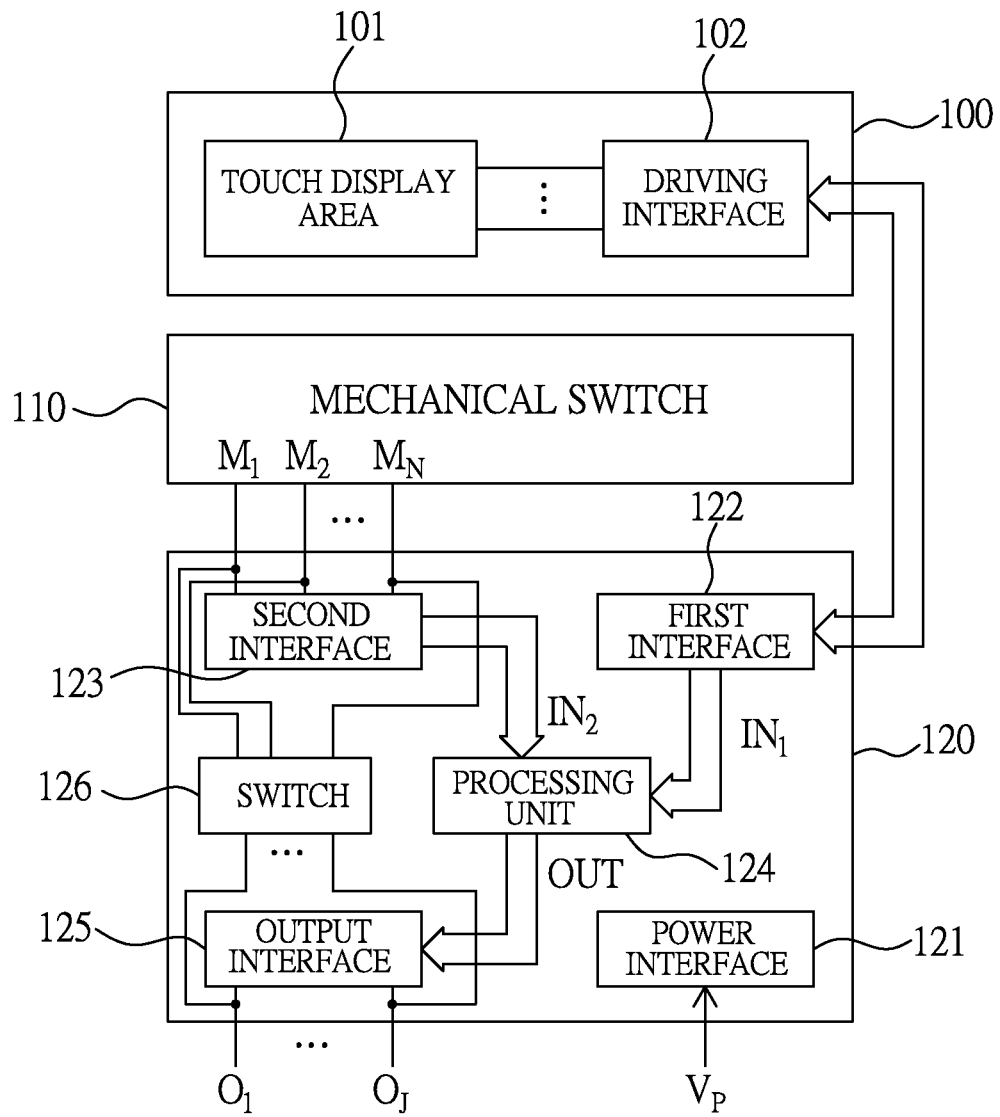
FIG. 3 illustrates another embodiment of a hybrid touch button of the present invention.

Please refer to FIG. 3, which illustrates another embodiment of a hybrid touch button of the present invention. As illustrated in FIG. 3, the hybrid touch button includes a touch display unit 100, a mechanical switch 110, and a control unit 120.

As the functions of the touch display unit 100 and the mechanical switch 110 have been described with reference to FIG. 2 above, they will not be readdressed.

The control unit 120 has a power interface 121, a first interface 122, a second interface 123, a processing unit 124, an output interface 125, and a switch 126.

As the functions of the power interface 121, the first interface 122, the second interface 123, the processing unit 124 and the output interface 125 have been described with reference to FIG. 2 above, they will not be readdressed.

The switch 126 can include at least one relay to connect at least one contact of the conductive contacts $M_1$-$M_N$ to the output interface 125 when the power source $V_P$ is disrupted.

Figure 4A:
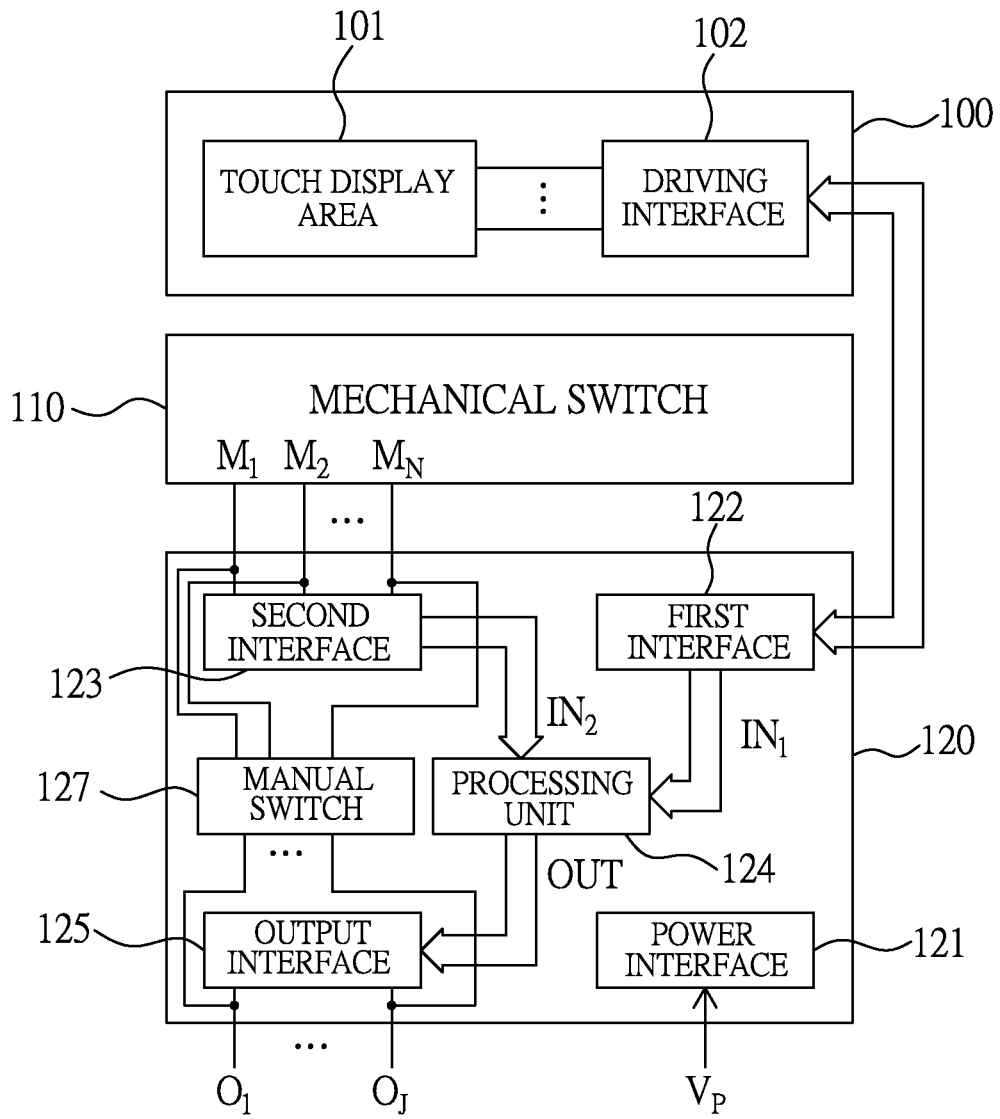
FIG. 4a illustrates another embodiment of a hybrid touch button of the present invention.

Please refer to FIG. 4a, which illustrates another embodiment of a hybrid touch button of the present invention. As illustrated in FIG. 4a, the hybrid touch button includes a touch display unit 100, a mechanical switch 110, and a control unit 120.

As the functions of the touch display unit 100 and the mechanical switch 110 have been described with reference to FIG. 2 above, they will not be readdressed. The control unit 120 has a power interface 121, a first interface 122, a second interface 123, a processing unit 124, an output interface 125, and a manual switch 127.

As the functions of the power interface 121, the first interface 122, the second interface 123, the processing unit 124 and the output interface 125 have been described with reference to FIG. 2 above, they will not be readdressed.

Figure 4B:
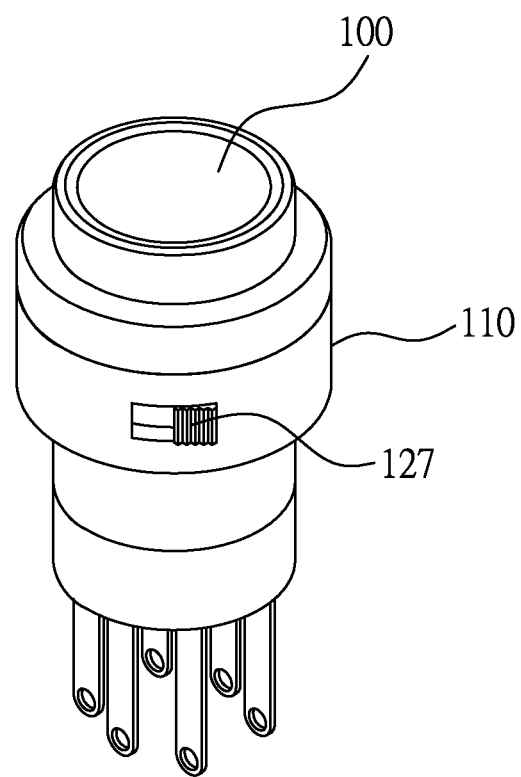
FIG. 4b illustrates an outline of the hybrid touch button of FIG. 4a having a DIP (dual in line package) switch for manual operation.

The manual switch 127 is used for a user to force at least one contact of the conductive contacts $M_1$-$M_N$ of the mechanical switch 110 to be connected with the output interface 125. Please refer to FIG. 4b, which illustrates an outline of the hybrid touch button of FIG. 4a having a DIP (dual in line package) switch for manual operation. With this design, a user can force the mechanical switch 110 to be connected with the output interface 125 via operating the DIP switch.

Figure 5:
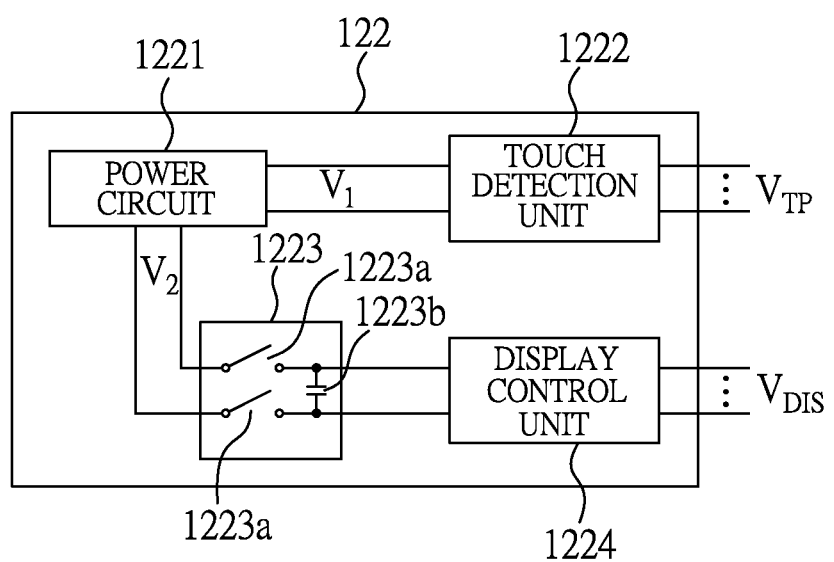
FIG. 5 illustrates an embodiment of the first interface of FIG. 2-4.

Besides, by adding an auxiliary capacitor circuit into the first interface 122, when the first interface 122 performs a touch detection procedure, the touch detection procedure can be free of interference from a display driving circuit. Please refer to FIG. 5, which illustrates an embodiment of the first interface of FIG. 2-4. As illustrated in FIG. 5, the first interface 122 includes a power circuit 1221, a touch detection unit 1222, an auxiliary capacitor circuit 1223, and a display control unit 1224.

The power circuit 1221 is used for providing a DC voltage $V_1$ to the touch detection unit 1222, and a DC voltage $V_2$ to the display control unit 1224.

The touch detection unit 1222 is powered by the DC voltage $V_1$ to deliver at least one touch detection signal $V_{TP}$ for performing a touch detection procedure, wherein the touch detection procedure is selected from a group consisting of a self-capacitive touch detection procedure, a mutual-capacitive touch detection procedure, and a hybrid-signal touch detection procedure. During the hybrid-signal touch detection procedure, the touch detection signal $V_{TP}$ is a hybrid signal of a DC voltage and an AC voltage.

The auxiliary capacitor circuit 1223 includes two switches 1223a and an auxiliary capacitor 1223b, wherein the auxiliary capacitor 1223b is used to store electric power, and the switches 1223a are used to disrupt the electric connection between the DC voltage $V_2$ and the display control unit 1224 when the touch detection unit 1222 performs the touch detection procedure, so as to isolate a display circuit including the display control unit 1224 and the display layer, and meanwhile the auxiliary capacitor 1223b will supply power to the display control unit 1224 to maintain a display function. That is, when the switches 1223a are turned on, the display control unit 1224 is powered by the DC voltage $V_2$ to deliver at least one pixel driving signal $V_{DIS}$ to perform a display driving procedure; when the switches 1223a are turned off, the display control unit 1224 is powered by the auxiliary capacitor 1223b to deliver at least one pixel driving signal $V_{DIS}$ to perform the display driving procedure.

Figure 6A:
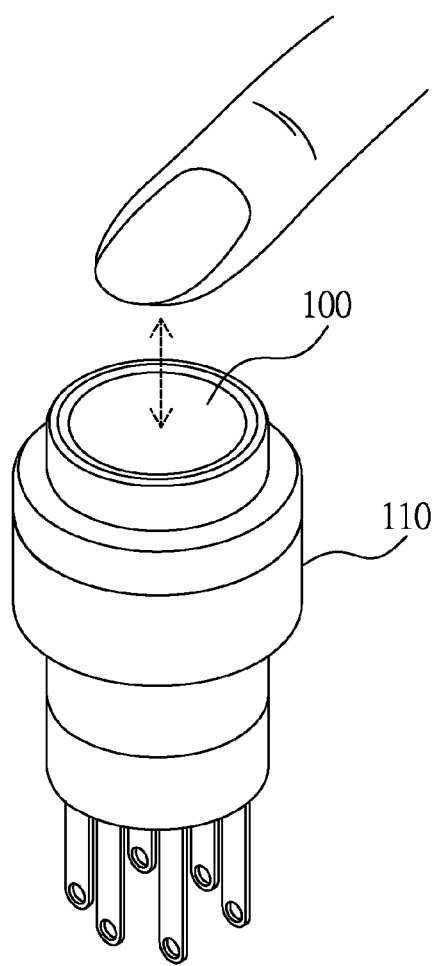
FIG. 6a-6b illustrates a hybrid operation on a hybrid touch button including a pushbutton switch of the present invention.
Figure 6B:
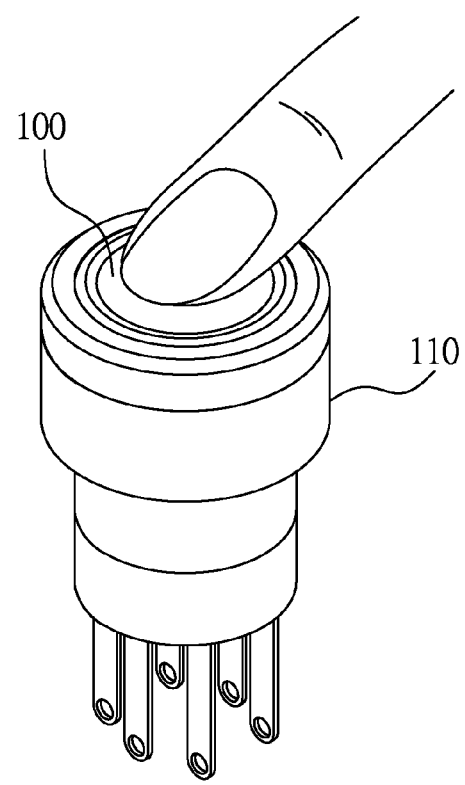

Please refer to FIG. 6a-6b, which illustrates a hybrid operation on a hybrid touch button including a pushbutton switch of the present invention, wherein FIG. 6a illustrates a touch (or hover) operation; FIG. 6b illustrates a press operation. The touch (or hover) operation can be used to choose a function option, and the press operation can be used to activate the function option.

Figures 7A, 7B:
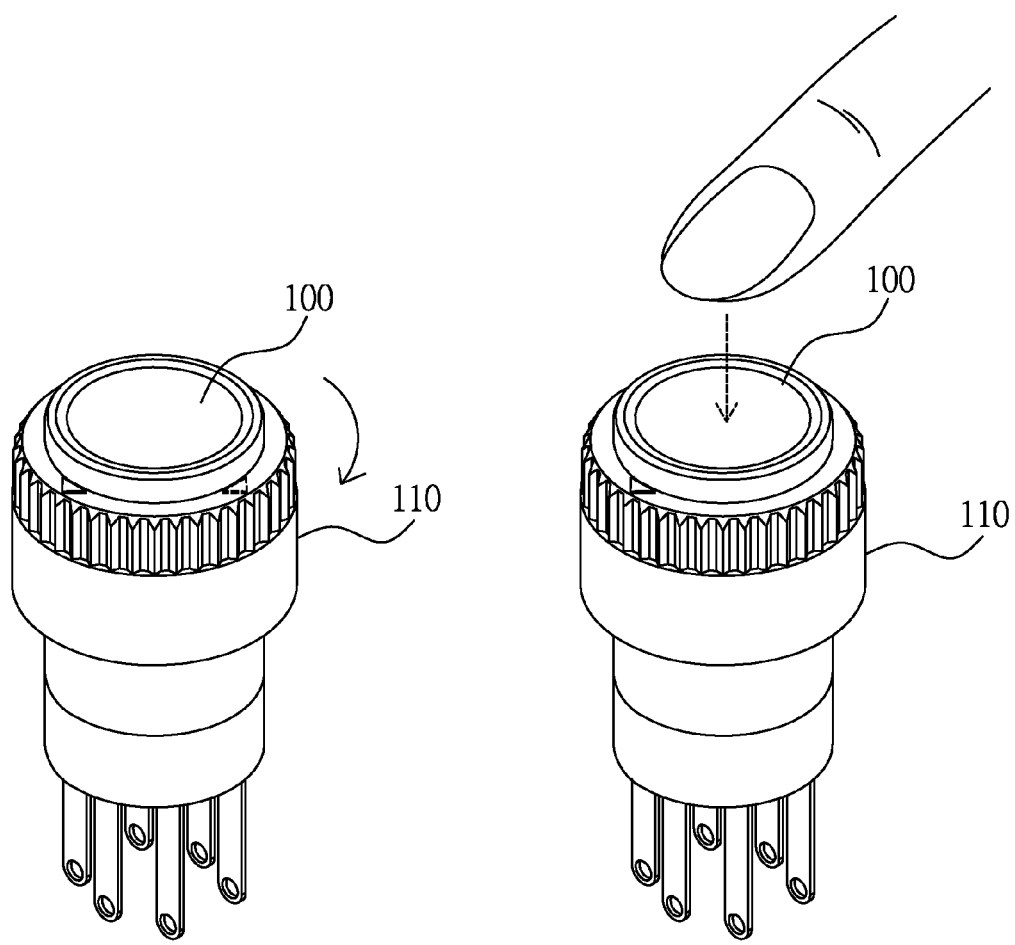
FIG. 7a-7b illustrates a hybrid operation on a hybrid touch button including a band switch of the present invention.

Please refer to FIG. 7a-7b, which illustrates a hybrid operation on a hybrid touch button including a band switch of the present invention, wherein FIG. 7a illustrates a rotation operation; FIG. 7b illustrates a touch (or hover) operation. The rotation operation can be used to choose a function option, and the touch (or hover) operation can be used to activate the function option.

Figure 8A:
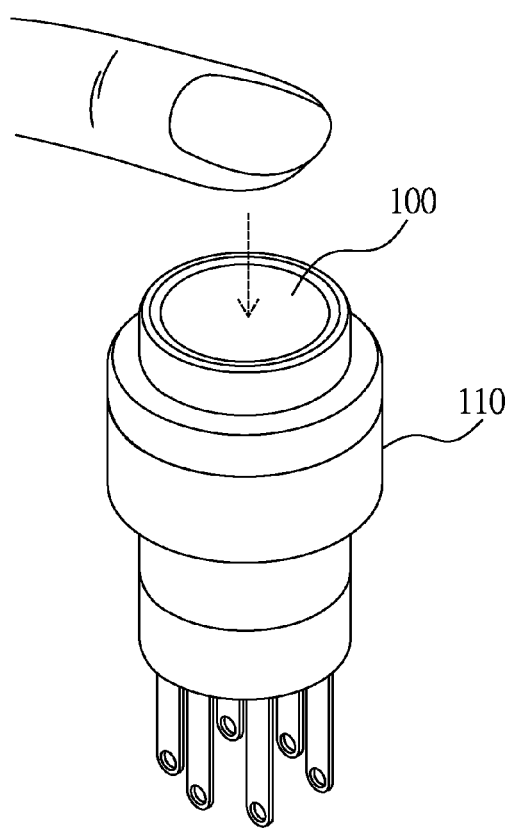
FIG. 8a-8b illustrates a hybrid operation on a hybrid touch button including a rocker switch of the present invention.
Figure 8B:
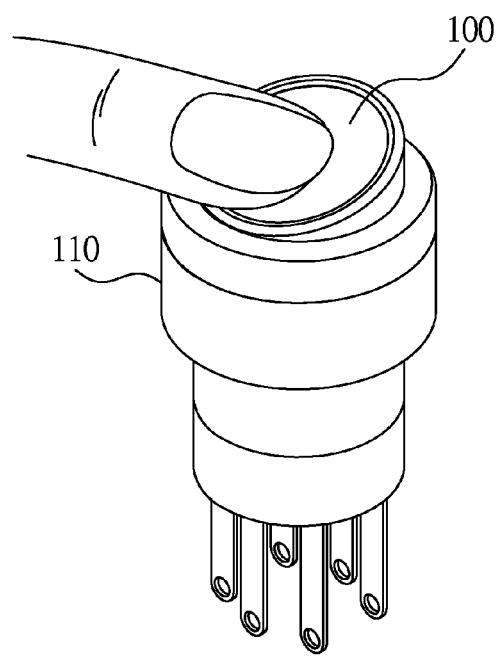

Please refer to FIG. 8a-8b, which illustrates a hybrid operation on a hybrid touch button including a rocker switch of the present invention, wherein FIG. 8a illustrates a touch (or hover) operation; FIG. 8b illustrates a press operation. The touch (or hover) operation can be used to choose a function option, and the press operation can be used to activate the function option.

Figure 9A:
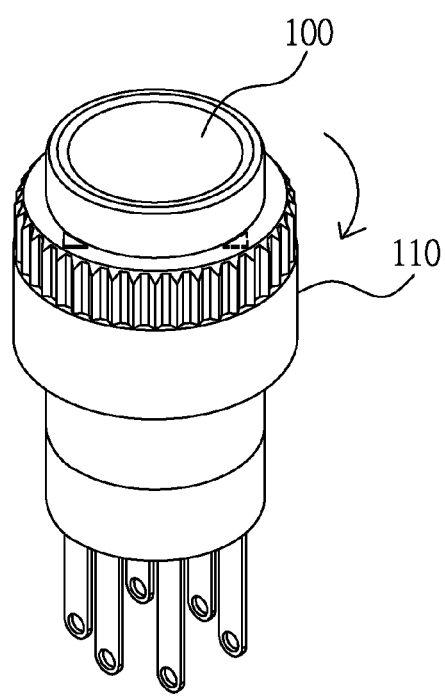
FIG. 9a-9c illustrates a hybrid operation on a hybrid touch button including a band switch and a pushbutton switch of the present invention.
Figure 9B:
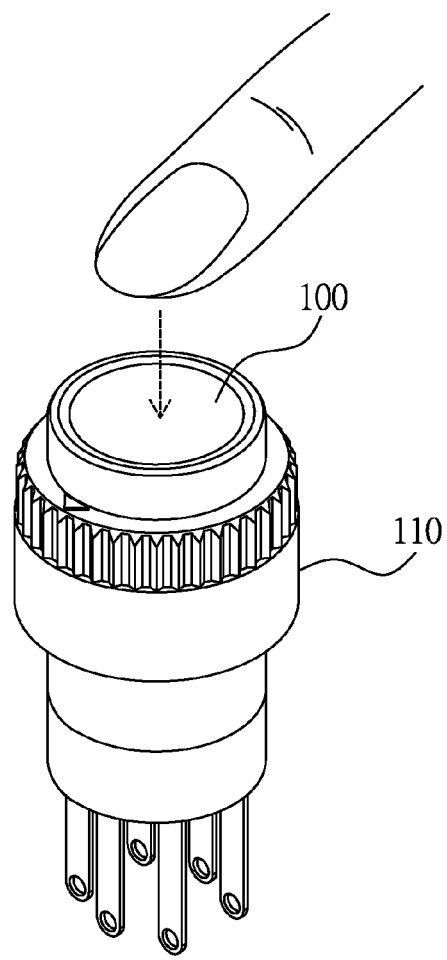
Figure 9C:
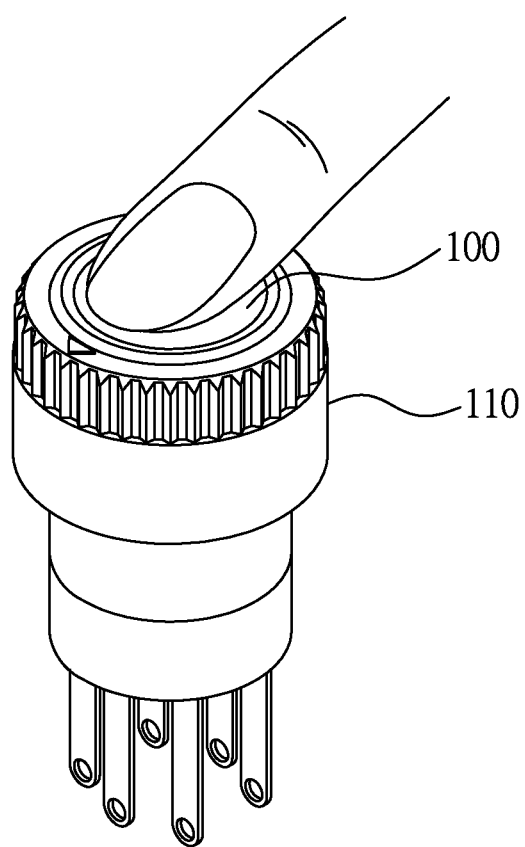

Please refer to FIG. 9a-9c, which illustrates a hybrid operation on a hybrid touch button including a band switch and a pushbutton switch of the present invention, wherein FIG. 9a illustrates a rotation operation; FIG. 9b illustrates a touch (or hover) operation; and FIG. 9c illustrates a press operation. The rotation operation and the touch (or hover) operation can be used to choose a function option, and the press operation can be used to activate the function option.

Figure 10:
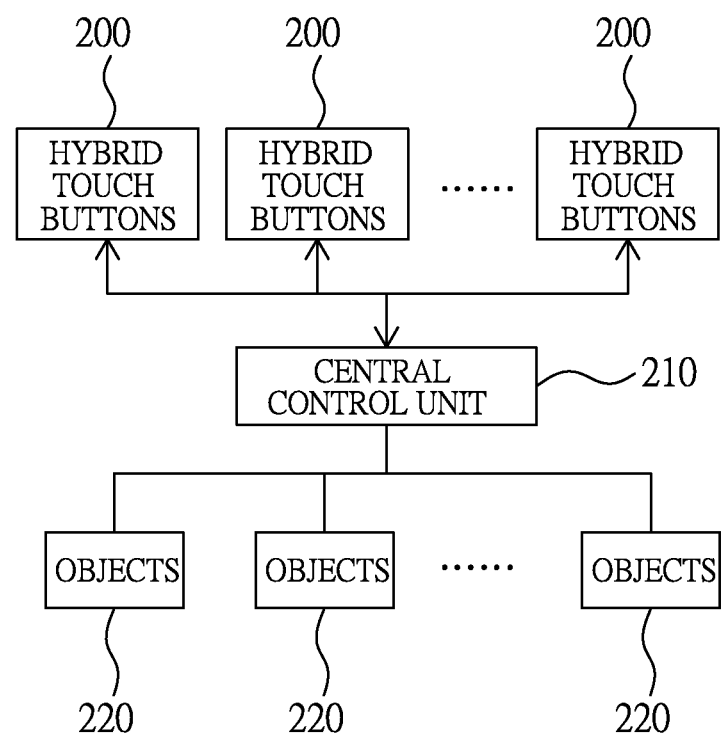
FIG. 10 illustrates a block diagram of an embodiment of a hybrid touch module of the present invention.

Based on the principles elaborated above, the present invention further proposes a hybrid touch module, which includes a plurality of hybrid touch buttons. Please refer to FIG. 10, which illustrates a block diagram of an embodiment of a hybrid touch module of the present invention. As illustrated in FIG. 10, the hybrid touch module includes a plurality of hybrid touch buttons 200, a central control unit 210 and a plurality of objects 220.

The hybrid touch buttons 200 and the central control unit 210 can be combined to form at least two structures, and one structure thereof is as follows:

each hybrid touch button 200 has a touch display unit and a mechanical switch, wherein the touch display unit has a touch display area, and the mechanical switch has a plurality of conductive contacts; the central control unit 210 coupled with the plurality of hybrid touch buttons 200, having a power interface for coupling with a power source, a first interface for driving the touch display area of each of the plurality of hybrid touch buttons, a second interface coupled with the plurality of conductive contacts of the mechanical switch of each of the plurality of hybrid touch buttons, and an output interface, wherein the central control unit 210 derives first input information from the first interface and second input information from the second interface, and determines an output configuration of the output interface according to the first input information and the second input information to control a plurality of objects 220.

Another structure thereof is as follows:

each hybrid touch button 200 includes: a touch display unit having a touch display area; a mechanical switch having a plurality of conductive contacts; and a control unit, having a power interface for coupling with a power source, a first interface for driving the touch display area, a second interface coupled with the plurality of conductive contacts, and an output interface, wherein the control unit derives first input information from the first interface and second input information from the second interface, and determines an output configuration of the output interface according to the first input information and the second input information; the central control unit 210 is coupled with the plurality of hybrid touch buttons 200 and a plurality of objects 220 to receive touch operation information from the plurality of hybrid touch buttons 200 and controls the plurality of objects 220 according to the touch operation information.

Thanks to the designs mentioned above, the present invention offers the advantages as follows:

1. The hybrid touch button of the present invention can reduce the number of mechanical contacts thereof
2. The hybrid touch button of the present invention can change the interconnection structure by software programming.
3. The hybrid touch button of the present invention can provide both a long operational life and a mechanical touch.
4. The hybrid touch button of the present invention can achieve high noise immunity by providing digital activating signals.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A hybrid touch button, including:
a touch display unit having a touch display area;
a mechanical band switch having a plurality of conductive contacts; and
a single control unit, having a power interface for coupling with a power source, a first interface coupled with the touch display area, a second interface coupled with the plurality of conductive contacts, and an output interface, wherein the single control unit derives first input information from the first interface coupled with the touch display area and second input information from the second interface coupled with the plurality of conductive contacts of the mechanical band switch, and generates at least one output control signal to the output interface to configure an output configuration of the output interface suitable for controlling at least one external object according to the first input information and the second input information, the output configuration including determining an electrical conduction state between at least two pins of the output interface or providing at least one digital activating signal via at least two pins of the output interface;
wherein the single control unit is programmed to enable the touch display unit and the mechanical band switch to be used for a hybrid operation, the hybrid operation including a rotation operation and a touch (or hover) operation, the mechanical band switch being used for the rotation operation and the touch display unit being used for the touch (or hover) operation, the rotation operation being used to choose a function option, and the touch (or hover) operation being used to activate the function option.

2. The hybrid touch button of claim 1, wherein the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being glued to or integrated with the display layer.

3. The hybrid touch button of claim 1, further including at least one switch, by which at least one contact of the plurality of conductive contacts can be connected to the output interface when the power source is disrupted.

4. The hybrid touch button of claim 1, further including at least one manual switch located on an exterior wall of the mechanical band switch, the at least one manual switch selectively connecting at least one contact of the plurality of conductive contacts and the output interface.

5. The hybrid touch button of claim 1, further including an auxiliary capacitor circuit for isolating a display circuit of the touch display unit and supplying power to the display circuit to maintain a display state when the single control unit performs a touch detection procedure, wherein the touch detection procedure is selected from a group consisting of a self-capacitive touch detection procedure, a mutual-capacitive touch detection procedure, and a hybrid-signal touch detection procedure.

6. A hybrid touch button, including:
a touch display unit having a touch display area;
a mechanical band switch having a plurality of conductive contacts; and
a single control unit, having a power interface for coupling with a power source, a first interface coupled with the touch display area, a second interface coupled with the plurality of conductive contacts, and an output interface, wherein the single control unit derives first input information from the first interface coupled with the touch display area and second input information from the second interface coupled with the plurality of conductive contacts of the mechanical band switch, and generates at least one output control signal to the output interface to configure an output configuration of the output interface suitable for controlling at least one external object according to the first input information and the second input information, the output configuration including determining an electrical conduction state between at least two pins of the output interface or providing at least one digital activating signal via at least two pins of the output interface;
wherein the mechanical band switch is combined with a pushbutton switch or a rocker switch, the single control unit is programmed to enable the touch display unit, the mechanical band switch and the pushbutton switch (or the rocker switch) to be used for a hybrid operation, the hybrid operation including a rotation operation, a press operation, and a touch (or hover) operation, the mechanical band switch being used for the rotation operation, the pushbutton switch (or the rocker switch) being used for the press operation, and the touch display unit being used for the touch (or hover) operation; and
wherein the rotation operation is used to choose a function option, and the touch (or hover) operation is used to activate the function option; or the touch (or hover) operation is used to choose a function option, and the press operation is used to activate the function option; or both the rotation operation and the touch (or hover) operation are used to choose a function option, and the press operation is used to activate the function option.

7. A hybrid touch module, including:
a plurality of hybrid touch buttons, each having a touch display unit and a mechanical band switch, wherein the touch display unit has a touch display area, and the mechanical band switch has a plurality of conductive contacts;
a single control unit coupled with the plurality of hybrid touch buttons, having a power interface for coupling with a power source, a first interface for driving the touch display area of each of the plurality of hybrid touch buttons, a second interface coupled with the plurality of conductive contacts of the mechanical band switch of each of the plurality of hybrid touch buttons, and an output interface, wherein the single control unit derives first input information from the first interface coupled with the touch display area of each of the plurality of hybrid touch buttons and second input information from the second interface coupled with the plurality of conductive contacts of the mechanical band switch of each of the plurality of hybrid touch buttons, and generates at least one output control signal to the output interface to configure an output configuration of the output interface according to the first input information and the second input information, the output configuration including determining an electrical conduction state between at least two pins of the output interface or providing at least one digital activating signal via at least two pins of the output interface; and a plurality of objects coupled with the output interface of the single control unit and controlled by the output configuration of the output interface;

wherein the single control unit is programmed to enable the touch display unit and the mechanical band switch to be used for a hybrid operation, the hybrid operation including a rotation operation and a touch (or hover) operation, the mechanical band switch being used for the rotation operation and the touch display unit being used for the touch (or hover) operation, the rotation operation being used to choose a function option, and the touch (or hover) operation being used to activate the function option.

8. A hybrid touch button, comprising:

a touch display unit having a touch display area;

a mechanical band switch having a plurality of conductive contacts; and a single control unit, having a power interface for coupling with a power source, a first interface coupled with the touch display area, a second interface coupled with the plurality of conductive contacts, and an output interface, wherein the single control unit derives first input information from the first interface coupled with the touch display area and second input information from the second interface coupled with the plurality of conductive contacts of the mechanical band switch, and generates at least one output control signal to the output interface to configure an output configuration of the output interface suitable for controlling at least one external object according to the first input information and the second input information, the output configuration including determining an electrical conduction state between at least two pins of the output interface or providing at least one digital activating signal via at least two pins of the output interface;

wherein the touch display unit includes a display layer and a touch sensing layer, the display layer being selected from a group consisting of a liquid crystal display layer, an organic light emitting diode display layer, a polymer light emitting diode display layer, and an electronic paper display layer, and the touch sensing layer being embedded in the display layer or implemented by display electrodes of the display layer;

wherein the single control unit is programmed to enable the touch display unit and the mechanical band switch to be used for a hybrid operation, the hybrid operation including a rotation operation and a touch (or hover) operation, the mechanical band switch being used for the rotation operation and the touch display unit being used for the touch (or hover) operation, the rotation operation being used to choose a function option, and the touch (or hover) operation being used to activate the function option.

9. The hybrid touch button of claim 8, further including at least one manual switch located on an exterior wall of the mechanical band switch, the at least one manual switch selectively connecting at least one contact of the plurality of conductive contacts and the output interface.

10. The hybrid touch button of claim 8, wherein the mechanical band switch is selected from a group consisting of a pushbutton switch, a rocker switch, a band switch, and any combination thereof.

11. The hybrid touch button of claim 8, further including at least one switch, by which at least one contact of the plurality of conductive contacts can be connected to the output interface when the power source is disrupted.

12. The hybrid touch button of claim 8, further including an auxiliary capacitor circuit for isolating a display circuit of the touch display unit and supplying power to the display circuit to maintain a display state when the single control unit performs a touch detection procedure, wherein the touch detection procedure is selected from a group consisting of a self-capacitive touch detection procedure, a mutual-capacitive touch detection procedure, and a hybrid-signal touch detection procedure.

* * * * *